United States Patent
Edamura et al.

(10) Patent No.: US 8,699,538 B2
(45) Date of Patent: Apr. 15, 2014

(54) QUANTUM CASCADE LASER

(75) Inventors: Tadataka Edamura, Hamamatsu (JP); Kazuue Fujita, Hamamatsu (JP); Tatsuo Dougakiuchi, Hamamatsu (JP); Masamichi Yamanishi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/297,588

(22) Filed: Nov. 16, 2011

(65) Prior Publication Data
US 2012/0134380 A1 May 31, 2012

(30) Foreign Application Priority Data

Nov. 26, 2010 (JP) ................................. 2010-264077
Sep. 6, 2011 (JP) ................................. 2011-194164

(51) Int. Cl.
*H01S 5/00* (2006.01)

(52) U.S. Cl.
USPC ................ 372/45.012; 372/45.01; 372/43.01; 372/44.01; 372/49.01

(58) Field of Classification Search
CPC ... H01S 5/3402; H01S 5/0285; H01S 5/0281; H01S 5/028; H01S 5/0287; H01S 5/3401; H01S 5/34
USPC ......... 372/45.012, 45.01, 44.01, 43.01, 49.01
See application file for complete search history.

(56) References Cited

U.S. PATENT DOCUMENTS

| | | | |
|---|---|---|---|
| 5,457,709 A | 10/1995 | Capasso et al. | |
| 5,509,025 A * | 4/1996 | Capasso et al. | 372/45.012 |
| 2005/0276298 A1 * | 12/2005 | Fischer et al. | 372/50.1 |
| 2006/0153262 A1 * | 7/2006 | Barbieri et al. | 372/43.01 |
| 2006/0215720 A1 * | 9/2006 | Corzine et al. | 372/50.11 |
| 2008/0219308 A1 * | 9/2008 | Yamanishi et al. | 372/44.01 |
| 2011/0007768 A1 | 1/2011 | Yamanishi et al. | |

FOREIGN PATENT DOCUMENTS

| | | |
|---|---|---|
| JP | 5-110188 | 4/1993 |
| JP | 10-200195 | 7/1998 |
| JP | 2008-10733 | 1/2008 |
| JP | 2009-206340 | 9/2009 |

OTHER PUBLICATIONS

Stéphane Blaser et al., "Room-temperature, continuous-wave, single-mode quantum-cascade lasers at λ=5.4 µm", Applied Physics Letters, 2005, pp. 041109-1-041109-3, vol. 86.

J. S. Yu et al., "High-power, room-temperature, and continuous-wave operation of distributed-feedback quantum-cascade lasers at λ~4.8 µ3," Applied Physics Letters, 2005, p. 041104-1-041104-3, vol. 87.

* cited by examiner

*Primary Examiner* — Kinam Park
(74) *Attorney, Agent, or Firm* — Drinker Biddle & Reath LLP (57) ABSTRACT

A quantum cascade laser is configured to include a semiconductor substrate, and an active layer that is provided on the substrate and has a cascade structure formed by alternately laminating emission layers and injection layers by multi-stage-laminating unit laminate structures each consisting of the quantum well emission layer and the injection layer, and generates light by intersubband transition in a quantum well structure. In a laser cavity structure for light with a predetermined wavelength generated in the active layer, a front reflection film with a reflectance of not less than 40% and not more than 99% for laser oscillation light is formed on the front end face that becomes a laser beam output surface, and a back reflection film with a reflectance higher than that of the front reflection film for the laser oscillation light is formed on the back end face.

2 Claims, 9 Drawing Sheets

| SEMICONDUCTOR LAYER | | COMPOSITION | LAYER THICKNESS | DOPING |
|---|---|---|---|---|
| INJECTION BARRIER LAYER 171 | | InAlAs | 3.5nm | undoped |
| EMISSION LAYER 17 | WELL LAYER 161 | InGaAs | 3.2nm | undoped |
| | BARRIER LAYER 172 | InAlAs | 2.3nm | undoped |
| | 162 | InGaAs | 7.7nm | undoped |
| | 173 | InAlAs | 0.7nm | undoped |
| | 163 | InGaAs | 6.0nm | undoped |
| | 174 | InAlAs | 1.3nm | undoped |
| | 164 | InGaAs | 5.4nm | undoped |
| EXIT BARRIER LAYER 191 | | InAlAs | 1.6nm | undoped |
| INJECTION LAYER 18 | WELL LAYER 181 | InGaAs | 4.1nm | undoped |
| | BARRIER LAYER 192 | InAlAs | 1.4nm | undoped |
| | 182 | InGaAs | 3.8nm | undoped |
| | 193 | InAlAs | 1.5nm | undoped |
| | 183 | InGaAs | 3.6nm | undoped |
| | 194 | InAlAs | 1.6nm | undoped |
| | 184 | InGaAs | 3.6nm | Si doped: $1 \times 10^{17}/cm^3$ |
| | 195 | InAlAs | 2.0nm | Si doped: $1 \times 10^{17}/cm^3$ |
| | 185 | InGaAs | 3.6nm | Si doped: $1 \times 10^{17}/cm^3$ |
| | 196 | InAlAs | 2.3nm | Si doped: $1 \times 10^{17}/cm^3$ |
| | 186 | InGaAs | 3.6nm | undoped |
| | 197 | InAlAs | 2.6nm | undoped |
| | 187 | InGaAs | 3.5nm | undoped |

QUANTUM CASCADE LASER

BACKGROUND OF THE INVENTION

1. Field of the Invention

The present invention relates to a quantum cascade laser using intersubband transition in a quantum well structure.

2. Related Background Art

Light with a mid-infrared wavelength region (for example, wavelength of 5 to 30 μm) is an important wavelength region in the field of spectroscopy analysis. As a high-performance semiconductor light source in this wavelength region, in recent years, quantum cascade lasers (QCL) have gained attention (for example, refer to Patent Documents 1 to 3 and Non-Patent Documents 1 and 2).

A quantum cascade laser is a monopolar type laser element which uses a level structure including subbands formed in a semiconductor quantum well structure and generates light by means of intersubband electron transition, and can realize high efficiency and high-output operations by multistage cascade-coupling of quantum well emission layers which are formed by quantum well structures and become active regions. Further, this cascade coupling of quantum well emission layers is realized by using electron injection layers for injecting electrons into emission upper levels and alternately laminating quantum well emission layers and injection layers.

Patent Document 1: US Patent Publication No. 5457709
Patent Document 2: Japanese Patent Application Laid-Open No. 2009
Patent Document 3: Japanese Patent Application Laid-Open No. 2008-10733
Patent Document 4: Japanese Patent Application Laid-Open No. H5-110188
Patent Document 5: Japanese Patent Application Laid-Open No. H10-200195
Non-Patent Document 1: S. Blaser et al., "Room-temperature, continuous-wave, single-mode quantum-cascade lasers at λ=5.4 μm," Appl. Phys. Lett. Vol. 86 (2005), pp. 041109-1 to 041109-3
Non-Patent Document 2: J. S. Yu et al., "High-power, room-temperature, and continuous-wave operation of distributed-feedback quantum-cascade lasers at λ-4.8 μm," Appl. Phys. Lett. Vol. 87 (2005), pp. 041104-1 to 041104-3

SUMMARY OF THE INVENTION

In a quantum cascade laser, generally, as described above, due to a monopolar type cascade structure formed by alternately multistage-laminating quantum well emission layers and injection layers and a cavity length longer than that of a normal LD or the like, the drive current and drive voltage are high, and the power consumption is as large as approximately 10 W (for example, refer to Non-Patent Documents 1 and 2), and a power supply exclusively for supply of power, etc., are necessary. In recent years, application of a quantum cascade laser to the field of environmental measurements has started, however, for example, under use conditions with limited power supply as in the case of outdoor measurements, mounting on aircraft, and mounting on satellites, etc., driving of the quantum cascade laser may become difficult.

On the other hand, a method in which the drive voltage of the quantum cascade laser is reduced by devising the quantum well structure in an active layer and a subband level structure according to the quantum well structure, is possible. However, with this configuration, it is difficult to achieve, at the same time, improvement in device performance such as reduction in threshold current of laser operations and improvement in operation efficiency. Another method in which an injection current amount is reduced by shortening the cavity length in the laser cavity structure is possible. However, with this short cavity structure, the drive current can be reduced even at the same current density, however, the oscillation threshold becomes higher, and a sufficient power-saving effect cannot be obtained.

The present invention has been made to solve the above-described problem, and an object thereof is to provide a quantum cascade laser capable of reducing power consumption.

In order to achieve the above object, a quantum cascade laser according to the present invention includes (1) a semiconductor substrate, and (2) an active layer that is provided on the semiconductor substrate and has a cascade structure formed by alternately laminating quantum well emission layers and injection layers by multistage-laminating unit laminate structures each consisting of the quantum well emission layer and the injection layer, and generates light by intersubband transition in a quantum well structure, wherein (3) in a laser cavity structure for light with a predetermined wavelength generated in the active layer, a front reflection film with a reflectance of not less than 40% and not more than 99% for laser oscillation light is formed on the front end face that becomes a laser beam output surface, and a back reflection film with a reflectance higher than that of the front reflection film for the laser oscillation light is formed on the back end face.

With the above-described configuration, concerning reduction in drive current and power consumption of the quantum cascade laser, a mirror loss in the laser cavity structure is of focus. Specifically, in the cavity structure of a quantum cascade laser, both end faces of the laser cavity are formed by, for example, cleavage. On the other hand, in the above-described quantum cascade laser, by forming a back reflection film with a high reflectance on the back end face of the cavity structure, a higher laser output is realized, and on the front end face opposed to the back end face, a front reflection film that has a reflectance of 40% or more and 99% or less for laser oscillation light and transmits a part of the laser oscillation light and outputs it as a laser beam to the outside is formed. Thus, by applying high-reflectance coating to both end faces of the laser device, it becomes possible to suppress the mirror loss in the cavity structure and reduce the drive current and power consumption of the quantum cascade laser.

According to the quantum cascade laser of the present invention, in the laser cavity structure for light with a predetermined wavelength generated by intersubband transition in the active layer having a cascade structure, by forming a front reflection film with a reflectance of not less than 40% and not more than 99% for laser oscillation light on the front end face that becomes a laser beam output surface and forming a back reflection film with a reflectance higher than that of the front reflection film for the laser oscillation light on the back end face, the mirror loss in the cavity structure can be reduced and the drive current and power consumption of the quantum cascade laser can be reduced.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Hereinafter, a preferred embodiment of a quantum cascade laser according to the present invention will be described in detail with reference to the drawings. In the description of the drawings, the same components are attached with the same reference symbols, and overlapping description will be omitted. Moreover, the dimensional ratios in the drawings are not always equal to those in the description.

Figure 1:
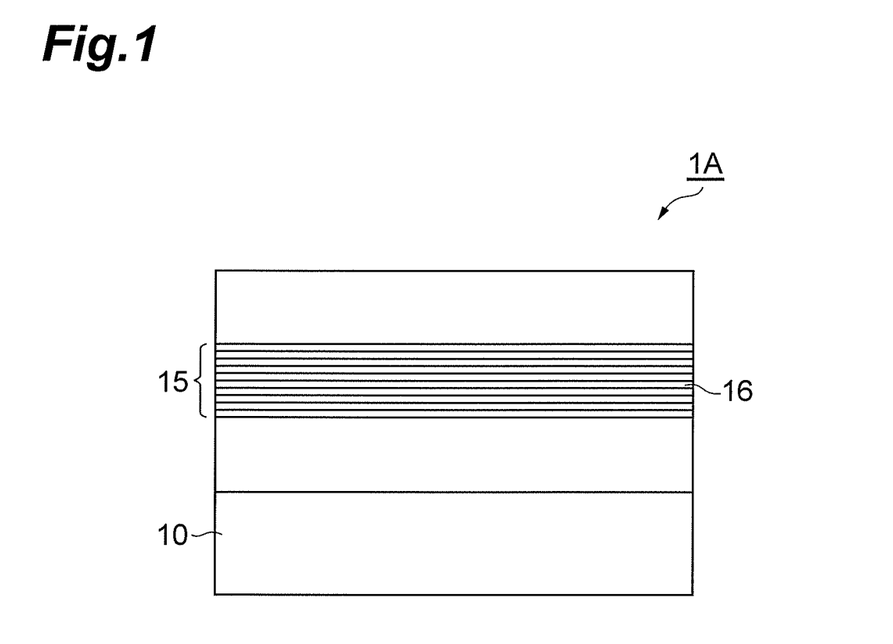
FIG. 1 is a view schematically showing a basic configuration of a quantum cascade laser.

FIG. 1 is a view schematically showing a basic configuration of a quantum cascade laser according to the present invention. A quantum cascade laser 1A of the present embodiment is a monopolar type laser element which generates light by using intersubband electron transition in a semiconductor quantum well structure. This quantum cascade laser 1A includes a semiconductor substrate 10 and an active layer 15 formed on the substrate 10. In FIG. 1, the laser cavity structure is not shown.

The active layer 15 has a cascade structure formed by alternately multistage-laminating quantum well emission layers to be used for generating light and electron injection layers to be used for injecting electrons into the emission layers. In detail, a semiconductor lamination structure consisting of a quantum well emission layer and an injection layer is a unit laminate structure 16 of one period, and by multistage-laminating the unit laminate structures 16, the active layer 15 having a cascade structure is formed. The number of laminations of the unit laminate structures 16 each including the quantum well emission layer and the injection layer is, for example, about several hundred, although it is arbitrarily set. The active layer 15 is formed on the semiconductor substrate 10 directly or via another semiconductor layer.

Figure 2:
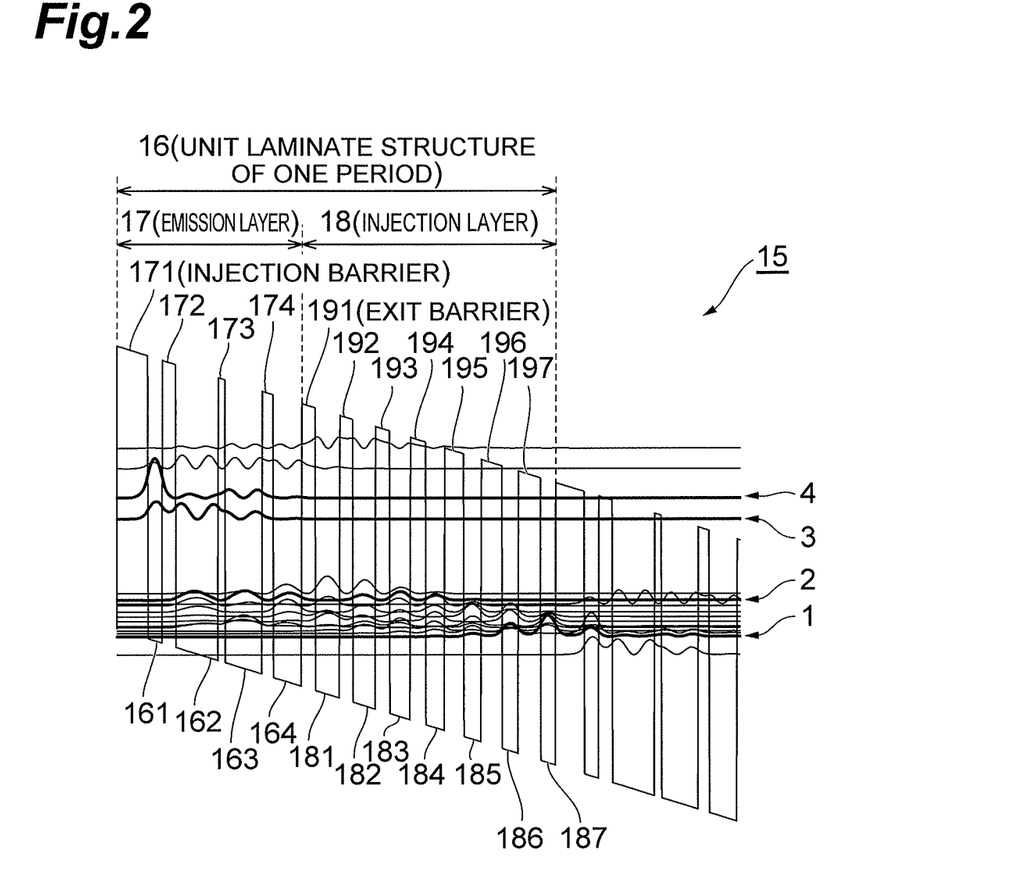
FIG. 2 is a diagram showing examples of a configuration of an active layer of the quantum cascade laser and a subband level structure in the active layer.

FIG. 2 is a diagram showing examples of a configuration of an active layer of the quantum cascade laser shown in FIG. 1, and a subband level structure to be formed in the active layer. FIG. 2 schematically shows the quantum well structure and the subband level structure in a part of the multistage repetitive structure of the unit laminate structures 16 in the active layer 15 of the quantum cascade laser 1A. In this figure, a position in the lamination direction inside the active layer is shown in the horizontal direction, and energy is shown in the vertical direction.

As shown in FIG. 2, each of the plurality of unit laminate structures 16 included in the active layer 15 consists of a quantum well emission layer 17 and an electron injection layer 18. Each of these emission layer 17 and injection layer 18 is formed to have a predetermined quantum well structure including quantum well layers and quantum barrier layers. Accordingly, in the unit laminate structure 16, a subband level structure that is an energy level structure according to a quantum well structure is formed.

In this configuration example, the unit laminate structure 16 of one period in the active layer 15 is formed as a quantum well structure formed by alternately laminating eleven quantum well layers 161 to 164 and 181 to 187 and eleven quantum barrier layers 171 to 174 and 191 to 197. In this lamination structure, the lamination portion consisting of the four well layers 161 to 164 and barrier layers 171 to 174 is the emission layer 17, and the lamination portion consisting of the seven well layers 181 to 187 and barrier layers 191 to 197 is the injection layer 18.

Among semiconductor layers of the emission layer 17, the quantum barrier layer 171 of the first stage is an injection barrier layer that is positioned between the injection layer of the preceding stage and the emission layer 17 and serves as an injection barrier for electrons from the injection layer of the preceding stage to the emission layer. Among semiconductor layers of the injection layer 18, the quantum barrier layer 191 of the first stage is an exit barrier layer that is positioned between the emission layer 17 and the injection layer 18 and serves as an exit barrier for electrons from the emission layer to the injection layer.

The unit laminate structure 16 shown in FIG. 2, in the subband level structure, has an emission upper level (level 3) and an emission lower level (level 2) as levels relating to light emission by means of intersubband transition. In addition to these emission upper level and lower level, the unit laminate structure 16 further has an injection level (level 4) as an energy level higher than the upper level 3 and a relaxation level (level 1) as an energy level lower than the lower level 2.

In this subband level structure, electrons e⁻ from the injection layer of the preceding stage are injected into the injection level 4 in the emission layer 17 due to a resonant tunneling effect via the injection barrier layer 171. The electrons injected into the injection level 4 are supplied to the upper level 3 by means of, for example, longitudinal optical (LO) phonon scattering, etc. Further, the electrons supplied to the upper level 3 emission-transit to the lower level 2, and at this time, light hv with a wavelength corresponding to the energy difference between the subband levels of the level 3 and the level 2 is generated. The electrons that transited to the lower level 2 are relaxed and extracted to the relaxation level 1 by means of the LO phonon scattering, etc. Accordingly, a population inversion for realizing laser oscillation between the upper level 3 and the lower level 2 is formed.

The electrons relaxed to the relaxation level 1 are injected into the injection level in the emission layer of the subsequent stage via the exit barrier layer 191 and the injection layer 18. These injection, emission transition and relaxation of electrons are repeated in the plurality of unit laminate structures 16 constituting the active layer 15, whereby light generation occurs in a cascade manner in the active layer 15. That is, by alternately laminating many emission layers 17 and injection layers 18, the electrons successively move through the laminate structures 16 in a cascade manner, and light hv is generated at the time of the intersubband transition in each laminate structure. Moreover, such light is resonated in the laser cavity structure of the laser 1A, whereby a laser beam with a predetermined wavelength is generated.

FIG. 2 shows examples of the semiconductor lamination structure, the quantum well structure, and the subband level structure in the unit laminate structure 16 of the active layer 15, and in detail, without limiting to the above-described configuration, various other configurations can also be adopted. Generally, any configuration of the active layer 15 can be adopted as long as the active layer has a cascade structure and is capable of generating light by intersubband transition in the quantum well structure. For example, in the subband level structure shown in FIG. 2, the injection level 4 and the relaxation level 1 may not be provided if they are unnecessary. The numbers of quantum well layers and barrier layers constituting the emission layer 17 and the injection layer 18 and layer thicknesses of these can also be arbitrarily set according to a specific level structure, etc., necessary for the light emitting operations.

Figure 3:
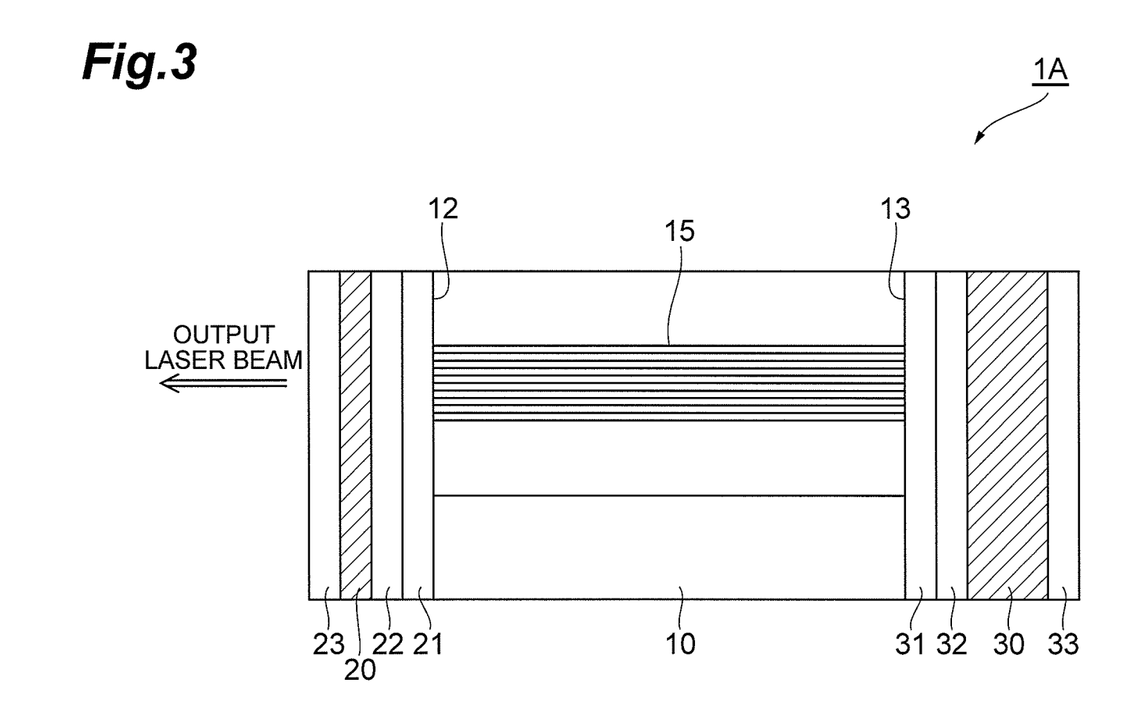
FIG. 3 is a view showing a laser cavity structure in the quantum cascade laser.

FIG. 3 is a view showing a laser cavity structure in the quantum cascade laser shown in FIG. 1. In the quantum cascade laser 1A according to the present embodiment, in the laser cavity structure for light hv with a predetermined wavelength to be generated in the active layer 15, provided on the front and back end faces opposed to each other in the resonating direction, a front reflection film 20 is formed on the front end face 12 serving as a laser beam output surface, and a back reflection film 30 is formed on the back end face 13.

The front reflection film 20 is configured to include, for example, an Au film, and formed to have a reflectance of not less than 40% and not more than 99% (for example, 60% or 95%) for the laser oscillation light with a predetermined wavelength λ oscillating in the cavity. The back reflection film 30 is configured to include, for example, an Au film in the same manner as the front reflection film 20, and formed to have a reflectance (for example, 100%) higher than that of the front reflection film 20 for the laser oscillation light.

In the configuration example shown in FIG. 3, in detail, an AlN film 21 with a film thickness of 214, a Ti film 22 with a film thickness of 5 nm, an Au film with a predetermined film thickness that becomes the front reflection film 20, and an AlN film 23 with a film thickness of 15 nm, are formed on the front end face 12 of the cavity structure of the laser 1A in this order. In addition, on the back end face 13 of the laser cavity structure, an AlN film 31 with a film thickness of λ/4, a Ti film 32 with a film thickness of 5 nm, an Au film with a predetermined film thickness that becomes the back reflection film 30, and an AlN film 33 with a film thickness of 15 nm, are formed in this order. For the whole layer structure including the front and back reflection films 20 and 30 respectively formed on the front and back end faces 12 and 13, in detail, various configurations other than the configuration shown in FIG. 3 can also be used.

The effects of the quantum cascade laser 1A of the present embodiment will be described.

In the above-described embodiment, for reducing the drive current and power consumption of the quantum cascade laser 1A, a mirror loss in the laser cavity structure is of focus. Here, in the cavity structure of a conventional quantum cascade laser, for example, both end faces of the laser cavity are formed by cleavage. In this case, a reflectance for laser oscillation light on the cleavage face is approximately 30%. Further, a configuration in which a total reflection film is formed on the back end face for a higher laser output is also possible, however, even with this configuration, it is still difficult to sufficiently reduce the drive current.

On the other hand, in the quantum cascade laser 1A shown in FIG. 1 to FIG. 3, by forming the back reflection film 30 with a high reflectance on the back end face 13 of the cavity structure, a higher laser output is realized. Further, on the front end face 12 opposed to the back end face 13, the front reflection film 20 that has a reflectance of 40% or more and 99% or less for the laser oscillation light and transmits a part of the laser oscillation light and outputs it as a laser beam to the outside is formed. Thus, by applying coating with high reflectance for a wavelength of the laser oscillation light to both end faces of the laser device, a mirror loss in the cavity structure is suppressed, and the effective drive current of the quantum cascade laser 1A is reduced, and accordingly, the power consumption of the laser can be reduced.

Reduction in mirror loss in the laser cavity structure using the above-described front and back reflection films and resultant reduction in drive current and power consumption of the quantum cascade laser will be described in greater detail.

The laser device oscillates when the gain overcomes the loss, and the oscillation threshold current $I_{th}$ is expressed by the following equation (1).

$$I_{th} \propto \frac{\alpha_i + \alpha_m}{g\Gamma} \quad (1)$$

Here, g is a gain factor, $\Gamma$ is a confinement factor, $\alpha_i$ is an internal loss, and $\alpha_m$ is a mirror loss. In this equation (1), the denominator of the right-hand side shows a gain and the numerator of the same shows a loss, respectively, and this equation shows that the larger the gain and the smaller the loss, the lower the threshold.

The internal loss $\alpha_i$ of the loss in the quantum cascade laser 1A is caused mainly by free carrier absorption in the waveguide structure inside the laser device. In the quantum cascade laser, the emission wavelength is in the mid-infrared region, so that the influence of the free carrier absorption is large, and the internal loss is essentially larger than in an LD, etc., in a communication wavelength band. For example, in a LD in a communication wavelength band, the internal loss $\alpha_i$ is approximately 10 to 20 cm$^{-1}$. On the other hand, the internal loss $\alpha_i$ in a quantum cascade laser having the conventional structure is approximately 40 to 50 cm$^{-1}$.

On the other hand, the mirror loss $\alpha_m$ can be expressed by the following equation (2).

$$\alpha_m = \frac{1}{L}\ln\left(\frac{1}{\sqrt{R_1 R_2}}\right) \quad (2)$$

Here, L is a cavity length, $R_1$ is a reflectance on the front end face, and $R_2$ is a reflectance on the back end face. This equation shows that the longer the cavity length L in the laser cavity structure and the higher the end face reflectances $R_1$ and $R_2$, the smaller the mirror loss $\alpha_m$. For example, in the LD in a communication wavelength band, the cavity length L is approximately 0.25 to 0.5 mm, and the mirror loss $\alpha_m$, is approximately 20 to 40 cm$^{-1}$.

Normally, when front and back end faces are respectively cleavage faces, the reflectance for the laser oscillation light is approximately 30%. Therefore, the mirror loss $\alpha_m$ in the quantum cascade laser in which both end faces of the cavity structure are cleavage faces is approximately 12 cm$^{-1}$ when the cavity length L=1 mm, and approximately 4 cm$^{-1}$ when L=3 mm. Generally, in the quantum cascade laser, in order to obtain a sufficient gain against a loss and cause oscillation, the cavity length L is made longer than that of a normal LD, and for example, the cavity length L is approximately 3 to 4 mm, and the mirror loss $\alpha_m$, is approximately 3 to 4 cm$^{-1}$. However, in the configuration in which the cavity length L is made longer, although the mirror loss can be reduced, the drive current and power consumption of the laser device increase.

On the other hand, as shown in FIG. 3, with the configuration in which the high-reflectance reflection films 20 and 30 are formed respectively on the front and back end faces 12 and 13 of the laser cavity structure, without increasing the cavity length L, both of a shorter cavity and reduction in mirror loss can be realized. For example, on the assumption that the reflectance for the laser oscillation light on the front reflection film 20 is 60% and the reflectance on the back reflection film 30 is 100%, when the cavity length L=3 mm, the mirror loss $\alpha_m$ is approximately 0.85 cm$^{-1}$.

In the above-described quantum cascade laser 1A, the reflectance for the laser oscillation light of the back reflection film 30 is set to be sufficiently higher than that of the front reflection film 20, and particularly preferably, the reflectance is set to be substantially 100% for the laser oscillation light. Thus, by forming the back reflection film 30 as a total reflection film, and forming the front end face as a partial transmission mirror and the back end face as a total reflection mirror, a laser cavity structure that increases the laser output and reduces the mirror loss $\alpha_m$ is preferably realized.

Each of the front reflection film 20 and the back reflection film 30 that are provided on the end faces of the laser cavity structure is preferably formed to include an Au film. The material of these reflection films 20 and 30 may be a material other than Au as long as the material has a high reflectance in a wavelength region, for example, the mid-infrared region of laser oscillation light.

The reflectances for the laser oscillation light respectively on the reflection films 20 and 30 can be controlled by the materials and film thicknesses, etc., of the films. As described above, when Au films are used as the front and back reflection films 20 and 30, concerning the film thicknesses of these, the Au film thickness of the front reflection film 20 is preferably 20 nm or less (200 Å or less). The Au film thickness of the back reflection film 30 is preferably 100 nm or more (1000 Å or more). By thus setting the Au film thicknesses of the reflection films, the reflectances in the laser cavity structure meeting the above-described conditions are preferably realized.

In the quantum cascade laser 1A, the laser cavity structure preferably has a cavity length L of not less than 0.15 mm and not more than 2 mm between the front end face 12 and the back end face 13. As described above, with the configuration in which the reflection films 20 and 30 are provided on the end faces 12 and 13 of the cavity structure, even when the cavity length L is thus set to be short, the oscillation threshold can be reduced to be equivalent to or smaller than the conventional threshold and the effective drive current can be reduced without deterioration in the device performance.

The quantum cascade laser 1A according to the above-described embodiment reduces the oscillation threshold current and the drive current by reducing the mirror loss $\alpha_m$, and this cavity structure may be combined with a quantum well structure and a subband level structure capable of reducing the internal loss $\alpha_i$ in the active layer 15. Accordingly, the oscillation threshold current and the drive current of the laser 1A can be further reduced.

As such a configuration, for example, as shown in FIG. 2, there is a configuration in which, in addition to the emission upper level 3 and the lower level 2, an energy level 4 higher than the upper level is provided in the subband level structure of the active layer 15. In this case, the high energy level 4 functions as, for example, an injection level that supplies electrons into the emission upper level 3 or a second emission upper level that contributes to light emission together with the upper level 3. In this configuration, most of the carriers accumulating in the injection layer are injected into the emission upper level of the emission layer, so that the influence of free carrier absorption is significantly reduced, and the internal loss $\alpha_i$ can be reduced to, for example, approximately 10 to 20 cm$^{-1}$.

Figure 4:
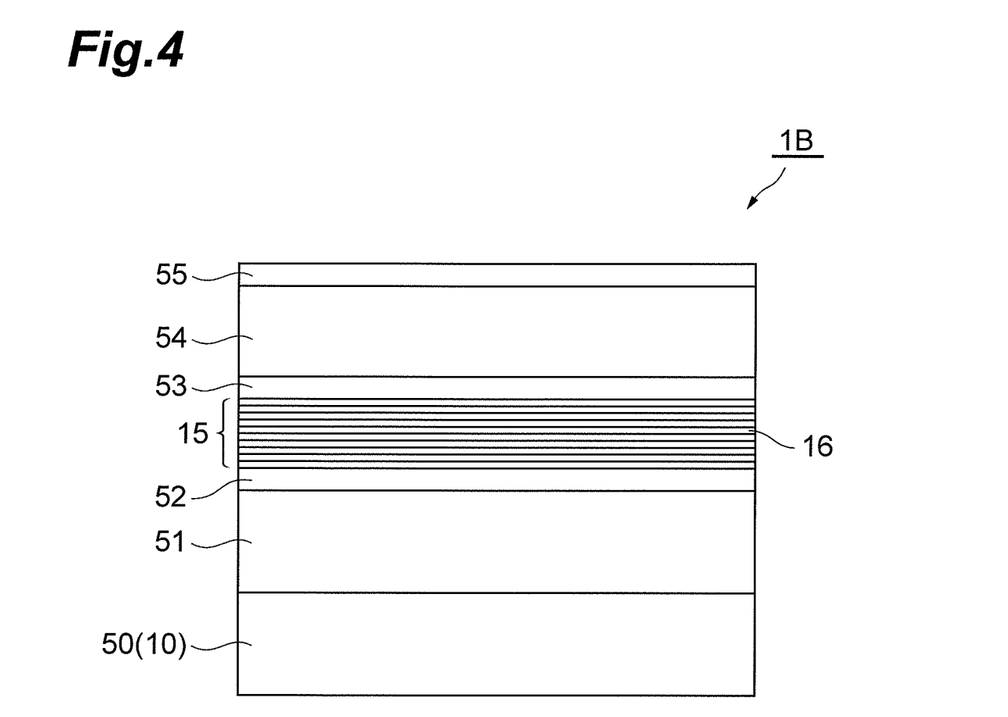
FIG. 4 is a view showing an example of a specific configuration of the quantum cascade laser.

A detailed example of the configuration of the quantum cascade laser according to the present invention will be described. FIG. 4 is a view showing an example of a specific configuration of the quantum cascade laser. As a method for forming the device structure of the quantum cascade laser, various methods can be adopted as long as a single crystal thin film with sufficiently high quality can grow. As such a forming method, for example, crystal growth by the molecular beam epitaxy (MBE) method or the metal-organic vapor phase epitaxy (MOVPE) method is available.

In the semiconductor lamination structure of the quantum cascade laser 1B shown in FIG. 4, an n-type InP single crystal substrate 50 is used as a semiconductor substrate 10. Then, on this InP substrate 50, in order from the substrate side, an InP lower cladding layer 51 with a thickness of 3.5 μm, an InGaAs lower guide layer 52 with a thickness of 0.25 μm, an active layer 15 formed by multistage-laminating unit laminate structures 16, an InGaAs upper guide layer 53 with a thickness of 0.25 μm, an InP upper cladding layer 54 with a thickness of 3.5 μm, and an InGaAs contact layer 55 with a thickness of 20 nm are laminated sequentially, and accordingly, the device structure of the quantum cascade laser 1B is formed. In this configuration example, the same laser cavity structure as in FIG. 3 (not shown in FIG. 4) is also used.

The active layer 15 in this configuration example is configured by laminating 40 periods of unit laminate structures 16 each including the quantum well emission layer 17 and the electron injection layer 18. The unit laminate structure 16 of one period is configured as a quantum well structure by alternately laminating eleven quantum well layers 161 to 164 and 181 to 187 and eleven quantum barrier layers 171 to 174 and 191 to 197 similar to the configuration example schematically shown in FIG. 2.

Figure 5:
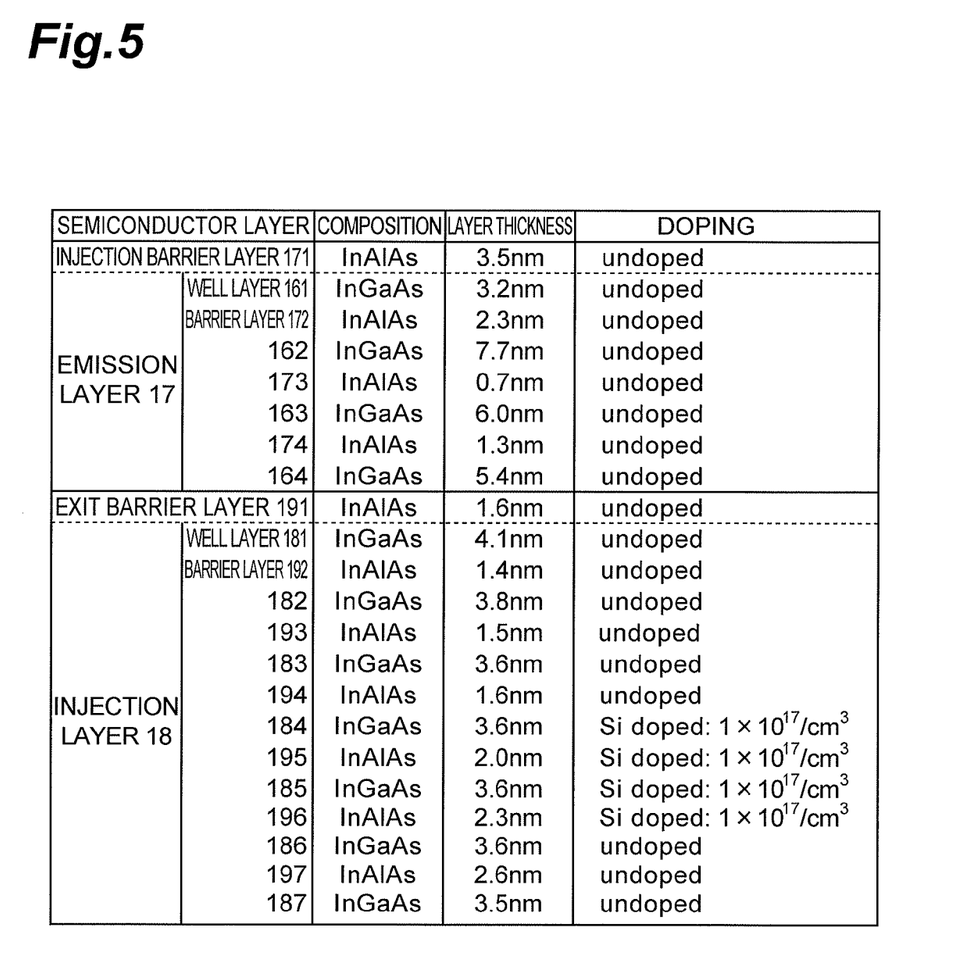
FIG. 5 is a chart showing an example of a structure of a unit laminate structure of one period in the active layer.

Among these semiconductor layers constituting the unit laminate structure 16, the quantum well layers are formed of InGaAs layers, respectively. The quantum barrier layers are formed of InAlAs layers, respectively. Accordingly, the active layer 15 consists of an InGaAs/InAlAs quantum well structure. FIG. 5 shows an example of a detailed structure of the unit laminate structure 16 of one period in the active layer 15. The wavelength of the laser oscillation light in this configuration example is λ=8.5 μM.

By applying high-reflectance coating to both end faces of the laser cavity structure of this semiconductor lamination structure by means of Au vapor deposition, the quantum cascade laser 1B is configured. In detail, on the front end face 12 (refer to FIG. 3) of the cavity structure, an Au film with a thickness of 10 nm (100 Å) that becomes the front reflection film 20 is formed. Further, on the back end face 13, an Au film with a thickness of 150 nm (1500 Å) that becomes the back reflection film 30 is formed.

In the above-described cavity structure, the reflectance for the laser oscillation light on the front end face is $R_1$=95.6%, and the reflectance on the back end face is $R_2$=100%. In this case, when the cavity length is L=3 mm, the mirror loss is $\alpha_m$=0.075 cm$^{-1}$, and when the cavity length is L=1 mm, the mirror loss is $\alpha_m$=0.22 cm$^{-1}$. In the configuration with a cavity length of L=1 mm, the light output is approximately 5 mW and the power consumption is 2.5 W or less.

Figure 6:
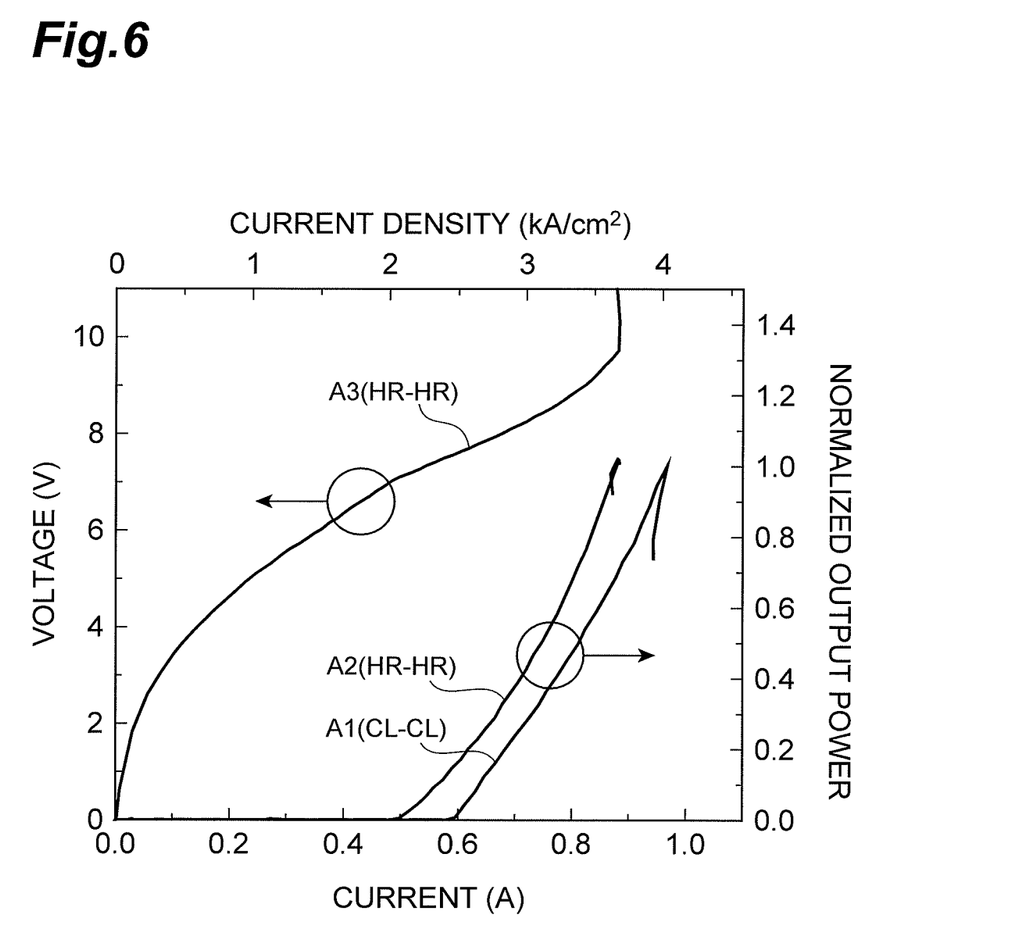
FIG. 6 is a graph showing current-voltage-light output performance of the quantum cascade laser.

FIG. 6 is a graph showing current-voltage-light output performance of the quantum cascade laser having the above-described configuration. In this graph, the horizontal axis indicates the current (A) or current density (kA/cm$^2$), and the vertical axis indicates the voltage (V) or normalized output power corresponding to light output normalized by a peak value. In the graph of FIG. 6, the graph A1 shows current density dependency of the output power when the cavity is configured by cleavage face-cleavage face (CL-CL), and the graph A2 shows current density dependency of the output power when the cavity is configured by reflection film-reflection film (HR-HR). The graph A3 shows current density dependency of the voltage when the cavity is configured by reflection film-reflection film. From these graphs, reduction in threshold current and improvement in slope efficiency in the configuration described above in which the reflection films are formed on both end faces of the laser cavity structure can be confirmed as compared with the configuration using cleavage faces without end face coating.

Figure 7:
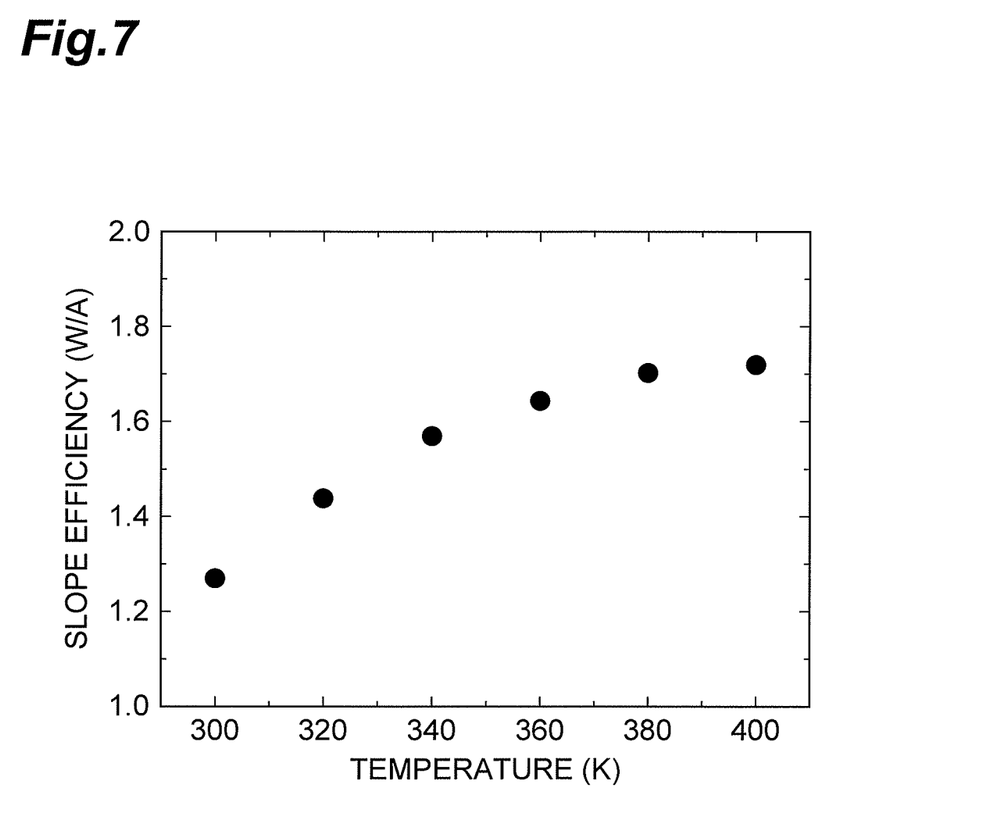
FIG. 7 is a graph showing temperature dependency of slope efficiency.

FIG. 7 is a graph showing temperature dependency of the slope efficiency. In this graph, the horizontal axis indicates the drive temperature (K), and the vertical axis indicates the slope efficiency (W/A). This graph proves that the slope efficiency increases in spite of the temperature increase. These results show that the mirror loss $\alpha_m$ is as extremely small as 1 cm$^{-1}$ or less, and the internal loss $\alpha_i$ is dynamically reduced by current injection. In addition, in this case, the peak light output is approximately 5 mW, so that the light output sufficient for spectroscopy analysis use is obtained.

Figure 8:
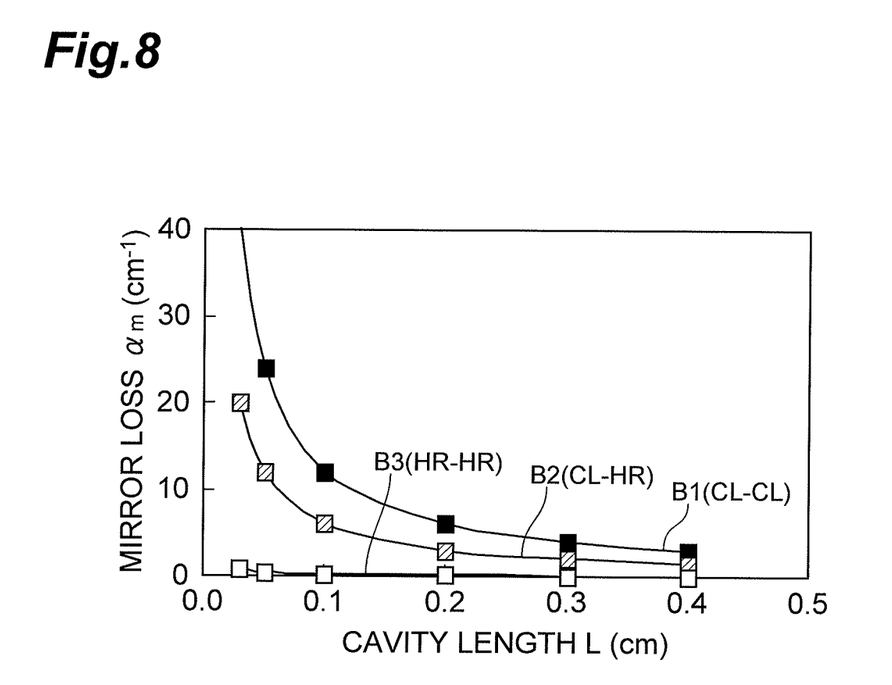
FIG. 8 is a graph showing cavity length dependency of mirror loss.

FIG. 8 is a graph showing cavity length dependency of the mirror loss. In this graph, the horizontal axis indicates the cavity length L (cm), and the vertical axis indicates the mirror loss $\alpha_m$ (cm$^{-1}$). In the graph of FIG. 8, the graph B1 shows a mirror loss when the cavity is configured by cleavage face (reflectance 30%)-cleavage face (30%), the graph B2 shows a mirror loss when the cavity is configured by cleavage face (30%)-reflection film (100%), and the graph B3 shows a mirror loss when the cavity is configured by reflection film (95%)-reflection film (100%). From this graph, it can be confirmed that the mirror loss $\alpha_m$ is sufficiently reduced in the above-described configuration in which the high-reflectance reflection films are formed on both end faces of the laser cavity structure, as compared with the configuration using cleavage faces on both end faces or the configuration in which a reflection film is formed on one of the end faces.

As described above, with the configuration in which reflection films are formed on both end faces of the laser cavity structure, reduction in threshold current and improvement in device performance such as improvement in slope efficiency can be realized. Further, by making the cavity shorter in length of the quantum cascade laser in the cavity structure using the front and back reflection films, the drive current can be reduced by the size effect without deterioration in the laser performance.

For example, when the cavity length L=0.5 mm (500 μm), the threshold current becomes 100 mA or less and the power consumption becomes approximately 1 to 2 W. In this case, power supply by using a dry cell or USB bus power of a personal computer, etc., is possible. If battery driving of the quantum cascade laser is possible, outdoor 24-hour monitoring, global environmental measurement by mounting on aircraft and mounting on satellite, etc., become possible.

Reduction in cavity length of the quantum cascade laser in the above-described laser cavity structure is effective not only for reducing the drive current by the size effect and reducing the power consumption but also for obtaining single axial mode oscillation.

Generally, the axial mode spacing $\lambda_{FSR}$ (FSR: free spectral range) is expressed by the following equation (3) with respect to the central wavelength $\lambda_0$.

$$\lambda_{FSR} = \frac{\lambda_0^2}{2n_{eff}L} \quad (3)$$

Here, $n_{eff}$ is an effective refractive index, and L is a cavity length.

Figure 9:
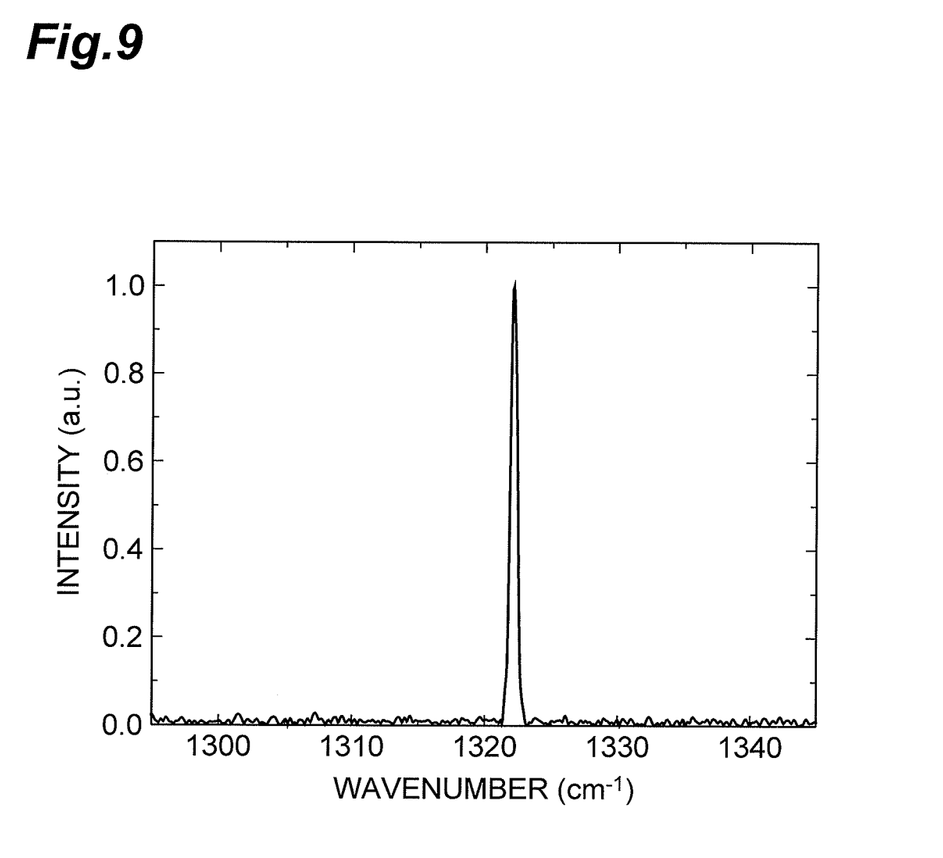
FIG. 9 is a graph showing an oscillation spectrum of the quantum cascade laser.

As it is understood from the equation (3) given above, as the cavity length L is made shorter, the axial mode spacing increases, and therefore, laser oscillation is apparently near single axial mode oscillation. Here, FIG. 9 is a graph showing an oscillation spectrum of the quantum cascade laser. In this graph, the horizontal axis indicates the wavenumber (cm$^{-1}$), and the vertical axis indicates the intensity (a.u.). This graph shows an oscillation spectrum when the quantum cascade laser is pulse-operated under condition that the cavity length is L=0.2 mm (200 μm), the drive current is I/I$_{th}$=2.5, the temperature is 300K, the pulse width is 100 nsec, and the repetition frequency is 100 kHz.

The graph of FIG. 9 proves that single axial mode oscillation is obtained under the above-described configuration and operating conditions even with the configuration without diffraction grating, etc., like a DFB laser. Further, with this configuration, single axial mode oscillation is obtained for a high injection current region almost four times as high as the threshold. A laser device whose power consumption is small and which can perform single axial mode oscillation is very effective for, for example, spectroscopic measurement and 24-hour real-time field measurement, etc.

The quantum cascade laser according to the present invention is not limited to the above-described embodiment and configuration examples, but can be variously modified. For example, in the configuration example described above, an InP substrate is used as the semiconductor substrate, and the active layer is made of InGaAs/InAlAs, however, specifically, various configurations can be used as long as emission transition due to intersubband transition in the quantum well structure is possible.

As the semiconductor material system, in addition to InGaAs/InAlAs described above, various material systems such as, for example, AlGaAs/GaAs, InAs/AlGaSb, AlGaN/InGaN, and Si/SiGe, etc., can also be used. Various methods can also be used as the semiconductor crystal growth method. As the lamination structure in the active layer of the quantum cascade laser and the semiconductor lamination structure as a whole of the laser device, various structures other than the above-described structures can also be used.

The quantum cascade laser according to the embodiment described above includes (1) a semiconductor substrate, and (2) an active layer that is provided on the semiconductor substrate and has a cascade structure formed by alternately laminating quantum well emission layers and injection layers by multistage-laminating unit laminate structures each including the quantum well emission layer and the injection layer, and generates light by intersubband transition in a quantum well structure, wherein (3) in a laser resonator structure for light with a predetermined wavelength generated in the active layer, a front reflection film with a reflectance of not less than 40% and not more than 99% to laser oscillation light is formed on the front end face that becomes a laser beam output surface, and a back reflection film with a reflectance higher than that of the front reflection film to the laser oscillation light is formed on the back end face.

Here, in the above-described quantum cascade laser, the back reflection film preferably has the reflectance of substantially 100% to the laser oscillation light. Accordingly, a laser cavity structure that can increase the laser output and reduce the mirror loss can be preferably realized.

The front reflection film and the back reflection film provided on both end faces of the laser cavity structure are preferably formed to include Au films, respectively. In this case, concerning the respective film thicknesses of the front and back reflection films, preferably, the Au film thickness of the front reflection film is 20 nm or less, and the Au film thickness of the back reflection film is 100 nm or more.

In the quantum cascade laser, the laser cavity structure preferably has a cavity length of not less than 0.15 mm and not more than 2 mm between the front end face and the back end face. With the configuration in which reflection films are provided on both end faces of the cavity structure as described above, even when the cavity length is thus set to be short, the oscillation threshold can be reduced to be equivalent to or less than the conventional threshold and the drive current can be reduced without deterioration in the device performance.

The present invention is applicable as a quantum cascade laser capable of reducing the drive current and power consumption.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A quantum cascade laser comprising:
a semiconductor substrate; and
an active layer that is provided on the semiconductor substrate and has a cascade structure formed by alternately laminating quantum well emission layers and injection layers by multistage-laminating unit laminate structures each consisting of the quantum well emission layer and the injection layer, and generates light by intersubband transition in a quantum well structure, wherein in a laser cavity structure for light with a predetermined wavelength generated in the active layer, a front reflection film with a reflectance of not less than 40% and not more than 99% for laser oscillation light is formed on the front end face that becomes a laser beam output surface, and a back reflection film with a reflectance of substantially 100% for the laser oscillation light is formed on the back end face, the laser cavity structure has a cavity length of not less than 0.15 mm and not more than 2 mm between the front end face and the back end face, the front reflection film and the back reflection film are formed to include Au films, respectively, and the Au film thickness of the front reflection film is 20 nm or less, and the Au film thickness of the back reflection film is 100 nm or more, and wherein the unit laminate structure included in the active layer has, in its subband level structure, an emission upper level, an emission lower level, and a high energy level as an energy level higher than the emission upper level, and the emission upper level and the emission lower level are levels relating to light emission by means of intersubband transition, and the high energy level functions as an injection level that supplies electrons into the emission upper level, or a second emission upper level that contributes to light emission together with the emission upper level.

2. The quantum cascade laser according to claim 1, wherein the unit laminate structure included in the active layer further has, in its subband level structure, a relaxation level as an energy level lower than the emission lower level, and electrons that transited to the emission lower level are relaxed and extracted to the relaxation level.

* * * * *